April 28, 1970 GIM YEE PONG ET AL 3,509,492

VOLTAGE CONTROLLED OSCILLATOR

Filed Feb. 20, 1968

INVENTORS
GIM YEE PONG
LEON RETTIG
BY
RSkolnick

United States Patent Office 3,509,492
Patented Apr. 28, 1970

3,509,492

VOLTAGE CONTROLLED OSCILLATOR

Gim Yee Pong, Uniondale, and Leon Rettig, Wantagh, N.Y., assignors to Sperry Rand Corporation, Ford Instrument Division, Long Island City, N.Y., a corporation of Delaware Filed Feb. 20, 1968, Ser. No. 706,872
Int. Cl. H03k 4/52
U.S. Cl. 331—111 8 Claims

ABSTRACT OF THE DISCLOSURE

An oscillator having a constant amplitude output and a frequency that is adjustable over a wide range is constructed by utilizing a capacitor that is charged from an adjustable voltage source to a voltage that is regulated by the breakdown voltage of a reverse connected Zener diode. When the charge on the capacitor reaches the regulated value, the capacitor discharges through a normally blocking silicon controlled rectifier whose control electrode is connected to the Zener diode so that the SCR is rendered conductive at the time the charge on the capacitor reaches the regulated value.

This invention relates to oscillators in general and more particularly to an oscillator having an adjustable frequency that is controlled by varying the amplitude of the supply voltage.

The prior art has provided many types of so-called voltage controlled oscillators for analog to digital conversion by utilizing integrated circuits and field effect transistors. However, for the most part such prior art oscillators are either complicated and expensive or have a very narrow dynamic range of variation in frequency or in supply voltage.

Accordingly, the object of the instant invention is to provide a simple construction for a voltage controlled oscillator having a relatively wide dynamic range of variation while the amplitude of the output voltage remains constant during frequency adjustment. Typically, the dynamic range achieved by utilizing the teachings of the instant invention is in the order of twenty to one.

The foregoing object of this invention will become readily apparent after reading the following description of the accompanying drawings in which.

Figure 1:
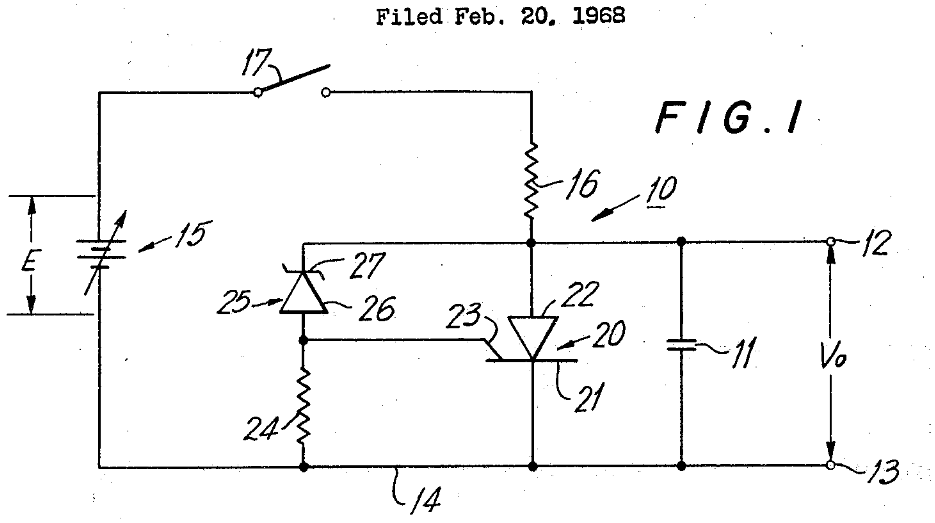
FIGURE 1 is a circuit diagram of an oscillator embodying the teachings of the instant invention.

Now referring to the figures. Voltage controlled oscillator 10 includes capacitor 11 across which output terminals 12, 13 are connected. One terminal of capacitor 11 is connected through bus 14 to the negative terminal of energy source 15 whose output voltage is adjustable. The other terminal of capacitor 11 is connected through load resistor 16 and normally open switch 17 to the positive terminal of source 15.

The main circuit of silicon controlled rectifier (SCR) 20 is connected in parallel with capacitor 11. More particularly, cathode 21 of SCR 20 is connected to common bus 14 while anode 22 of SCR 20 is connected to output terminal 12. Gate electrode 23 of SCR 20 is connected to the junction between temperature stabilization resistor 24 and anode 26 of Zener diode 25. The end of resistor 24 remote from diode 25 is connected to bus 14 while cathode 27 of diode 25 is connected to output terminal 12.

Operation of the circuit of FIGURE 1 commences when switch 17 is closed. Capacitor 11 begins to charge toward the supply voltage E (adjusted voltage output of source 15) with a time constant determined by the product of resistor 16 and capacitor 11. Since SCR 20 and Zener diode 25 are both nonconducting at this time, the leakage resistances of SCR 20, Zener diode 25, and capacitor 11 are large and their shunting effect is negligible.

When the voltage across capacitor 11 reaches the breakdown voltage of Zener diode 25, SCR 20 is switched into the conducting state by its gate current which flows through diode 25. The resistance between anode 22 and cathode 21 falls to a very low value so that capacitor 11 completely discharges through SCR 20. With capacitor 11 discharged, Zener diode 25 and SCR 20 return to their non-conducting states and capacitor 11 begins to charge once again to supply voltage E so that the cycle previously described repeats itself.

Figure 2:
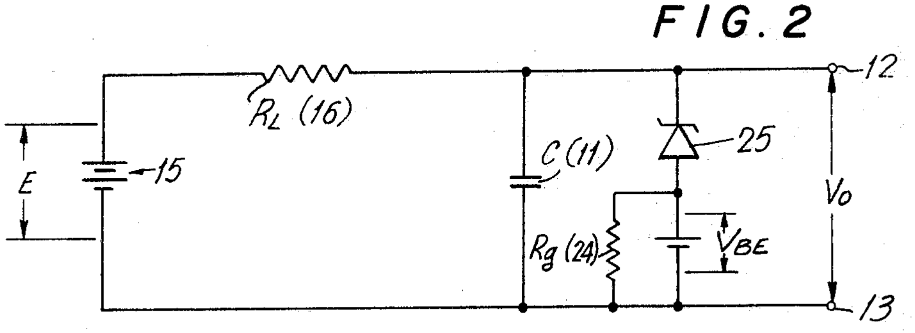
FIGURE 2 is an equivalent circuit of the oscillator of FIGURE 1 during the period when the SCR is not conducting.

The equivalent circuit of oscillator 10 during the non-conducting period for SCR 20 and diode 25 is shown in FIGURE 2. During steady state conditions, the maximum amplitude of output voltage $V_O$ of oscillator 10 is equal to the sum of the breakdown voltage $V_Z$ of Zener diode 25 and $V_{BE}$, with $V_{BE}$ being the forward voltage drop between the gate 23 and cathode 21 of SCR 20. Since $V_{BE}$ is constant, it is hereinafter considered as a part of $V_Z$.

The expression for the transient response of the circuit of FIGURE 2 to a step input is:

$$V_o = E\left(1 - e^{-\frac{t}{R_L C}}\right) \quad (1)$$

However, the maximum output is limited by the breakdown voltage of Zener diode 25 so that Equation 1 can be written as:

$$V_Z = E\left(1 - e^{-\frac{t}{R_L C V}}\right) \quad (2)$$

The time $t = T_C$ required for capacitor 11 to charge to the level of the Zener breakdown voltage $V_Z$ can be obtained by solving for $t$ from Equation 2.

Solving Equation 2 for $t$ we find that:

$$T_Z = R_L C \ln\left(\frac{E}{E - V_z}\right) \quad (3)$$

Where ln is the natural logarithm.

Figure 3:
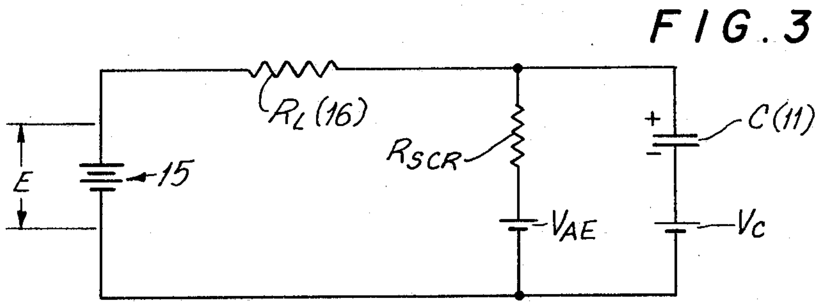
FIGURE 3 is an equivalent circuit of the oscillator of FIGURE 1 during the period when the SCR is conducting.

The equivalent circuit for oscillator 10 during the conducting period for SCR 20 and diode 15 is shown in FIGURE 3 wherein $R_{SCR}$ is the internal resistance of SCR 20 during the conducting period; $V_{AE}$ is the forward voltage drop between anode 22 and cathode 21 of SCR 20, and $V_c$ is the voltage charge across capacitor 11 just before SCR 20 starts to conduct and its value is $V_Z$. $R_{SCR}$ is in the order of 1 ohm maximum and $R_L$ is in the order of 1,000 ohms or higher for low frequencies of oscillation. The discharge time $T_D$ for capacitor 11 is computed from the following Equation 4.

$$T_D = (R_{SCR})(C) \ln\left(\frac{V_c}{V_{AE}}\right) \quad (4)$$

Using actual values, $T_C$ is found to be much greater than $T_D$, so that for low frequencies of oscillation the period of a single cycle T is then approximately equal to $T_C$. Thus. Equation 3 can be rewritten as:

$$T = T_c = R_L C \ln\left(\frac{E}{E - V_Z}\right) \quad (5)$$

The frequency of oscillation is approximately equal to the reciprocal of the period T. Therefore, the equation for the frequency output of oscillator 10 is:

$$F=\frac{1}{T}=\frac{1}{R_L C \ln\left(\frac{E}{E-V_Z}\right)} \quad (6)$$

Figure 4:
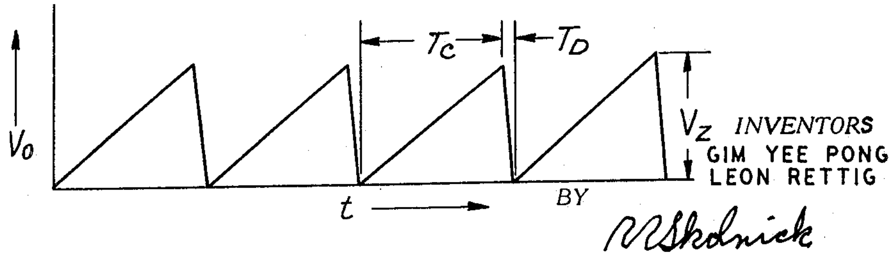
FIGURE 4 is a graph showing the waveform of the output voltage produced by the circuit of FIGURE 1.

Since $V_Z$ is constant, the frequency output of oscillator 10 can be controlled by adjusting the supply voltage E as shown by Equation 6. The waveform of output voltage $V_o$ is a saw-tooth as shown in FIGURE 4.

In order to trigger SCR 20 into conduction, a minimum trigger current is required. This trigger current is supplied by source 15 through resistor 16 and diode 25, with part of this current from source 15 being diverted from gate 23 through resistor 24.

Just before SCR 20 starts to conduct, capacitor 11 is charged to approximately the breakdown voltage for Zener diode 25 and the main circuit through anode 22 and cathode 21 is open, or blocking. Current drawn from source 15 at this time is just for triggering SCR 20, although not all of it goes to gate 23. This current is the minimum current required to trigger SCR 20 into conduction and upon triggering of SCR 20 discharge of capacitor 11 commences. Therefore, oscillator 10 requires a minimum voltage $E_{min}$ in order to function. This minimum voltage is calculated from Equation 7.

$$E_{min}=i_t R_L + V_Z \quad (7)$$

where $i_t$ is the minimum current required from source 15 to trigger SCR 20 into conduction.

The maximum voltage limitation imposed on source 15 is a function of resistor 16 and the holding current for SCR 20. If the anode-cathode current for SCR 20 is equal to or higher than the holding current, SCR 20 locks itself in the conducting state even when its gate current is removed. Under such circumstances, capacitor 11 will not recharge and the oscillator will cease to function.

The maximum voltage $E_{max}$ is calculated from Equation 8.

$$E_{max}=i_{AM} R_L \quad (8)$$

where $i_{AM}$ is the maximum anode-cathode current through SCR 20 without SCR 20 locking itself in.

A special condition exists where:

$$E_{max}>i_{AM} R_L \quad (9)$$

for large values of capacitor 11.

This occurs since a large capacitor across the anode-cathode circuit of SCR 20 produces a negative voltage at anode 22 during the conducting period so that SCR 20 can turn itself off even when $i_{AM}$ is greater than the hold current. Experimentally values of $E_{max}$ equal to ten times $i_{AM}R_L$ have been obtained.

As previously noted, there is a minimum and a maximum supply voltage which can be used for oscillator 10. The voltage variation from minimum value to maximum value is defined as the dynamic range of voltage $E_R$ and is expressed by Equation 10.

$$E_R=\frac{E_{max.}}{E_{min.}} \quad (10)$$

By substituting Equations 7 and 8 into Equation 10, we obtain:

$$E_R=\frac{i_{AM} R_L}{i_t R_L + V_Z} \quad (11)$$

If the capacitor 11 is large then:

$$E_R>\frac{R_L i_{AM}}{i_t R_L + V_z} \quad (12)$$

because, as stated in Equation 9, $E_{max}$ is then greater than $i_{AM}R_L$.

Since the frequency output of oscillator 10 depends on the magnitude of the supply voltage E, a minimum and maximum frequency can be calculated. The minimum frequency $F_{min}$ is calculated from Equation 13:

$$F_{min.}=\frac{1}{R_L C \ln\left(\frac{E_{min.}}{E_{min.}-V_Z}\right)} \quad (13)$$

and the maximum frequency $F_{max}$ is calculated from Equation 14

$$F_{max.}=\frac{1}{R_L C \ln\left(\frac{E_{max.}}{E_{max.}-V_Z}\right)} \quad (14)$$

The dynamic range of frequency $F_R$ is defined as the ratio to $F_{max}$ to $F_{min}$. Thus:

$$F_R=\frac{\ln\left(\frac{E_{min.}}{E_{min.}-V_Z}\right)}{\ln\left(\frac{E_{max.}}{E_{max.}-V_Z}\right)} \quad (15)$$

By substituting Equation 7 for $E_{min}$ and Equation 8 for $E_{max}$ in Equation 15, we find that:

$$F_R=\frac{\ln\left(\frac{i_t R_L + V_Z}{i_t R_L}\right)}{\ln\left(\frac{i_{AM} R_L}{i_{AM} R_L - V_Z}\right)} \quad (16)$$

If capacitor 11 is large, then:

$$F_R=\frac{\ln\left(\frac{i_t R_L + V_Z}{i_t R_L}\right)}{\ln\left(\frac{i_{AM} R_L}{i_{AM} R_L - V_Z}\right)}$$

Experimentally, values of as much as 20 for dynamic range of frequency $F_R$ have been obtained with large values for capacitor 11.

Typical values for the circuit elements of FIGURE 1 are listed in the table below.

Resistor 16.—2917 ohms
Resistor 24.—500 ohms
Capacitor 11.—10 microfarads
SCR 20.—type 2N1774 manufactured by General Electric
Zener diode 25.—type 1N750A manufactured by Motorola.

With the above values for the elements of oscillator 10 and with source 15 adjustable between 25 and 375 volts, the output of oscillator 10 can be varied between 913 and 15,900 cycles per second.

Thus it is seen that the instant invention provides a particularly simple circuit for a voltage controlled oscillator having an especially large dynamic frequency range.

Although there has been described a preferred embodiment of this novel invention, many variations and modifications will now be apparent to those skilled in the art. Therefore, this invention is to be limited, not by the specific disclosure herein, but only by the appending claims.

The embodiments of the invention in which an exclusive privilege or property is claimed as defined as follows:

1. A voltage controlled oscillator comprising output leads across which an oscillating signal of variably controllable frequency and substantially constant amplitude is developed a capacitor connected directly across said output leads, a variable voltage source, a circuit for charging said capacitor from said source, first circuit means connected directly across said capacitor for limiting the voltage developed across said capacitor to a predetermined level, a normally current-blocking second circuit means connected directly across said capacitor through which said capacitor discharges upon reaching said predetermined level, said second circuit means comprising a controllably conductive solid state device including a control element connected at a junction between a pair of circuit elements within said first circuit means, and means for adjusting said variable voltage source to control the time interval required for said capacitor to charge to said predetermined level, thereby controlling the frequency of said oscillating signal.

2. An oscillator as set forth in claim 1 in which said first circuit means comprises a reverse connected Zener diode circuit element directly connected at said junction to a temperature compensating resistor circuit element, said first circuit means being connected in circuit with said source.

3. An oscillator as set forth in claim 2 in which said second circuit means comprises a silicon controlled rectifier.

4. An oscillator as set forth in claim 3 in which said diode circuit element includes a first anode and a first cathode, said control electrode being connected at said junction to said first anode.

5. An oscillator as set forth in claim 4 in which said silicon controlled rectifier includes a second anode and second cathode, said capacitor being directly connected in circuit to said second anode and said seond cathode.

6. An oscillator as set forth in claim 5 in which said second anode is directly connected to said cathode.

7. An oscillator as set forth in claim 5 in which a second impedance element is connected in said circuit for charging said capacitor, said second impedance element being connected directly between said first cathode and said source.

8. An oscillator as set forth in claim 1 in which said source includes a positive and a negative terminal, said second cathode being connected directly to said negative terminal, said second impedance element being connected to said positive terminal.

References Cited

UNITED STATES PATENTS

| | | | |
|---|---|---|---|
| 3,265,991 | 8/1966 | Ferguson ----------- | 331—111 |
| 3,302,128 | 1/1967 | Schoemehl et al. ----- | 331—111 |

JOHN KOMINSKI Primary Examiner

U.S. Cl. X.R.

331—177